United States Patent [19]

Ohba et al.

[11] 4,032,952
[45] June 28, 1977

[54] BULK CHARGE TRANSFER SEMICONDUCTOR DEVICE

[75] Inventors: Shinya Ohba, Kokubunji; Iwao Takemoto, Kodaira; Masaharu Kubo, Hachioji, all of Japan

[73] Assignee: Hitachi, Ltd., Japan

[22] Filed: Apr. 3, 1973

[21] Appl. No.: 347,426

[30] Foreign Application Priority Data

| Mar. 7, 1973 | Japan | 48-26113 |
| Apr. 3, 1972 | Japan | 47-32655 |
| July 26, 1972 | Japan | 47-74865 |
| Jan. 16, 1973 | Japan | 48-6645 |
| Jan. 24, 1973 | Japan | 48-9521 |
| Feb. 2, 1973 | Japan | 48-2966 |
| Feb. 2, 1973 | Japan | 48-2967 |

[52] U.S. Cl. .................................. 357/24
[51] Int. Cl.$^2$ ........................... H01L 29.78
[58] Field of Search ............ 317/235; 357/24

[56] References Cited

UNITED STATES PATENTS 3,792,322  2/1974  Boyle et al. .................. 317/235

*Primary Examiner*—Edward J. Wojciechowicz
*Attorney, Agent, or Firm*—Craig & Antonelli

[57] ABSTRACT

In a charge transfer semiconductor device majority carriers are transferred within a semiconductor body on a substrate from means for introducing majority carriers to means for detecting transferred majority carriers by applying pulsed voltages to a series of electrodes disposed on an insulating layer which is disposed on one surface of the semiconductor body between the introducing means and the detecting means. Depletion regions are formed within the semiconductor body, so that one end of a depletion region below one electrode reaches the substrate and another end of a depletion region below an electrode next to the one electrode does not reach the substrate, whereby majority carriers below the one electrode are pushed out below the next electrode.

73 Claims, 57 Drawing Figures

BULK CHARGE TRANSFER SEMICONDUCTOR DEVICE

This invention relates to a charge transfer semiconductor device and, more particularly, to a charge transfer semiconductor device wherein majority carriers are transferred as signals.

As well known, charge transfer semiconductor devices are being considered because of their simplicity in construction, the easiness of their fabrication, and application to devices such as shift registers, image devices, and display devices.

A charge coupled semiconductor device which is one of charge transfer semiconductor devices has MIS (metal-insulator-semiconductor) structure, which is well known in the art. Typically, such a device comprises a semiconductor body, an insulating layer disposed on one surface of the semiconductor body, means for introducing electric charge carriers into the semiconductor body, a series of electrodes disposed on the insulating layer for transferring the electric charge carriers introduced into the semiconductor body along the surface of the semiconductor body adjacent to the insulating layer, means connected to the electrodes for applying an electric field for transferring the carriers to the semiconductor body, and means for detecting the carriers thus transferred.

As the electric charge carriers, the minority carriers in the semiconductor body are utilized, since a semiconductor is suitable for generating minority carriers. That is, when the semiconductor body is of n-type, holes are utilized as electric charge carriers, and when the semiconductor body is of p-type, electrons are utilized.

The charge coupled semiconductor device functions in the following manner.

A D.C. voltage is applied to one of the electrodes on the insulating layer, so that a depletion region is produced in the surface portion of the semiconductor body adjacent to the insulating layer corresponding to the electrode. Since this depletion region is produced only in the surface portion of the semiconductor body immediately below the electrode applied with the D.C. voltage, a potential well is formed at that portion.

In this stage, minority carriers are introduced into the semiconductor body by means of, for example, the application of a forward voltage to a p-n junction in the device, an inducement of an avalanche phenomenon in a Metal-Oxide-Semiconductor structure, or an irradiation of radiant rays or light. These minority carriers are then collected in the potential well portion.

A D.C. voltage, having a larger voltage than the voltage already applied to the first electrode, is applied to another electrode adjacent the first electrode, with a consequence that a deeper potential well is formed thereunder.

Since carriers in a shallow potential well shift to the deep potential well, the minority carriers are transferred to the surface portion in the semiconductor body immediately below the next electrode. After the transit of the minority carriers, the D.C. voltage applied to the first electrode is cut off and the voltage on the next electrode is reduced to a level equal to the voltage for the first electrode. Thus, the minority carriers originally collected immediately below the first electrode are completely transferred to the portion in the semiconductor body immediately below the next electrode.

By repeatedly applying D.C. voltages in the manner as described above, it is possible to transfer the minority carriers from electrode to electrode.

Principles and fundamental structures of charge coupled semiconductor devices are described in detail in *Charge Coupled Semiconductor Devices*, by W. S. Boyle and G. E. Smith, The Bell System Technical Journal, Volume 49, No. 4(April, 1970), pages 587 – 593.

Though minority carriers are transferred by applying three-phase pulsed D.C. voltages to a trio of electrodes in the above-mentioned report, they are also transferred by applying two-phase pulsed D.C. voltages to pairs of electrodes for a changing thickness of the insulating layer under each electrode of the pairs of electrodes.

However, the conventional charge coupled semiconductor devices as described above have the following drawbacks, since minority carriers are utilized as a signal, and are transferred along the surface of the semiconductor body.

1. Since the mobility of the surface of the semiconductor body is about half that of the inside of the semiconductor body, the transfer velocity of the carriers is low.

2. Since there are many traps at the surface of the semiconductor body, the carriers are influenced by the traps; hence, the transferring efficiency is low.

3. Since there is a surface potential barrier between the electrodes, all of the carriers are not transferred completely; hence, the transferring efficiency is low.

4. Since the transfer direction is linear, when a significant degree of transit is required, the charge coupled semiconductor device becomes too long; hence it becomes difficult to obtain a semiconductor device of high integration.

5. Since the transfer efficiency is low as described above, the intensity of the output signal is low; hence, it becomes difficult to distinguish the output signal from noise.

The present invention, therefore, provides a novel charge transfer semiconductor device which overcomes the foregoing defects and difficulties.

It is an object of the present invention to provide a charge transfer semiconductor device whose carrier transfer velocity is very high.

It is another object of the present invention to provide a charge transfer semiconductor device having a high transfer efficiency.

It is a further object of the present invention to provide a charge transfer semiconductor device whose output signal is high.

It is still a further object of the present invention to provide a charge transfer semiconductor device which has the capability of providing a high degree of semiconductor integration.

These objects of the present invention are realized by utilizing majority carriers as a signal and transferring the majority carriers within the semiconductor body.

The additional objects and advantages of the present invention will become apparent from the following description which is taken in conjunction with the accompanying drawings, wherein.

For a better understanding of the present invention, the embodiments thereof will be described hereunder with the semiconductor body of n-type only, that is, the majority carriers are limited to electrons. However, it should be understood, of course, that semiconductor bodies of p-type, that is, majority carriers in the form of holes, may be used as well.

This invention provides a charge transfer semiconductor device comprising, as its fundamental components, a substrate, a semiconductor body disposed on the substrate, which is electrically isolated from the substrate, a series of electrodes disposed on the semiconductor body, which is electrically isolated from the semiconductor body, and means for applying an electric field to the semiconductor body through the electrodes, the thickness of the semiconductor body being less than the depletion length to be formed below the electrode and the width of the semiconductor body being less than the total length of:

i. the width of an electrode perpendicular to the transit direction of majority carriers and in a direction parallel to the surface of the semiconductor body, and ii. twice the depletion width spread from the edges of an electrode toward a direction perpendicular to the transit direction of the majority carriers and parallel to the surface of the semiconductor body.

For better understanding of the present invention, a conventional charge coupled semiconductor device will be explained with reference to FIG. 1.

Figure 1:
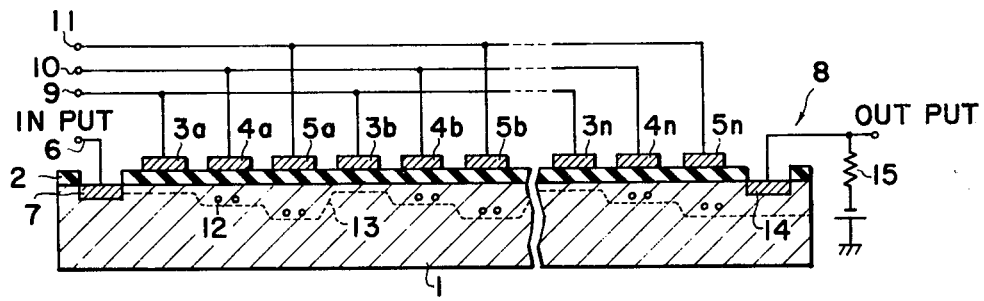
FIG. 1 shows, in longitudinal section, an explanatory view of a conventional charge coupled semiconductor device.

Shown in FIG. 1 is a longitudinal view of the conventional charge coupled semiconductor device, which comprises an n-type semiconductor body 1, an insulating layer 2 disposed on one main surface of the semiconductor body 1, a series of electrodes 3a, 3b, ..., 3n, 4a, 4b, ..., 4n, 5a, 5b, ..., 5n disposed on the insulating layer 2 which are arranged in trios of 3a, 4a, 5a up to the last trio of 3n, 4n, 5n, an input means, that is, minority carrier generating means 6 which is a p-n junction disposed between a p-type region 7 and the semiconductor body 1, and means 8 for detecting the minority carriers, which is disposed next to the last electrode 5n of the series of electrodes. Conductors 9, 10 and 11 are respectively connected to every third electrode.

When a negative voltage is applied to the electrodes 3a, 3b, ..., 3n through the conductor 9, a negative voltage, whose potential is lower than that of the negative voltage applied to the electrodes 3a, 3b, ..., 3n, is applied to the electrodes 4a, 4b, ..., 4n through the conductor 10, and a negative voltage, whose potential is lower than that of the negative voltage applied to the electrodes 4a, 4b, ..., 4n, is applied to the electrodes 5a, 5b, ..., 5n through the conductor 11, so that a potential curve 13 is formed in the semiconductor body 1.

At this stage, when a high electric field is applied externally, through the p-n junction, minority carriers 12 are generated in the surface portion of the semiconductor body 1 under the insulating layer 2, and then the minority carriers 12 are shifted toward the lower electric potential, that is, toward the portion below the electrode 3a, to the portion below the electrode 4a, and to the portion below the electrode 5a. Next, when the voltage already applied to the electrodes 3a, 3b, ..., 3n is applied to the electrodes 4a, 4b, ..., 4n through the conductor 10, when the voltage already applied to the electrodes 4a, 4b, ..., 4n is applied to the electrodes 5a, 5b, ..., 5n through the conductor 11, and when the voltage already applied to the electrodes 5a, 5b, ..., 5n is applied to the electrodes 3a, 3b, ..., 3n through the conductor 9, the minority carriers 12, already shifted below the electrode 5a, are shifted below the electrode 3b. That is, the minority carriers 12 are transferred from the portion immediately below the electrode 5a to the portion immediately below the electrode 3b. Therefore, when the voltages to be applied to the electrodes 3a, 3b, ..., 3n; 4a, 4b, ..., 4n; and 5a, 5b, ..., 5n are controlled in a well-timed relationship, the minority carriers 12 are transferred along the surface of the semiconductor body 1 from the input means 6 to the output means 8.

The transferred minority carriers 12 are detected at the output means 8, that is, through a reverse biased p-n junction formed between a p-type region 14 and the semiconductor body 1, and the resistor 15.

In the case of a number of transferring electrodes, however, when the potentials are lowered in succession, the semiconductor body 1 or the insulating layer 2 eventually suffers electrical breakdown. For this reason, in a charge coupled semiconductor device having the fundamental structure as illustrated in FIG. 1, trios of transferring electrodes 3a, 4a, 5a; 3b, 4b, 5b; ...; 3n, 4n, 5n are utilized, and three-phase pulsed voltages are periodically applied thereto. Thus, it is usually used in a region in which the electric potential exerted does not lead to electrical breakdown. It has been found that minority carriers are also transferred in the same direction with a group of two-phase pulsed voltages, e.g., by varying the thickness of the insulating film under the electrodes (refer, for example, to IEEE ISSCC, Collection of Preliminary Manuscripts for Lectures in spring, 1971, Pages 158 – 167).

This conventional charge coupled semiconductor device has the drawbacks, as described above, that the transferring velocity, the transferring efficiency and the intensity of the output signal are low, since the minority carriers are transferred as a signal.

The principles of the present invention will now be explained with reference to FIGS. 2 and 3.

Throughout these figures, which illustrate the above-mentioned fundamental components, the reference numeral 20 indicates a single crystal of sapphire ($\alpha$-$Al_2O_3$) 21 an n-type Si body, 22 an insulating layer of $SiO_2$, 23a, 23b, ... 23n, 24a, 24b, ..., 24n, 25a, 25b, ..., 25n metal electrodes, 26 input means including $n^+$-type region 27 and 28 output means including $n^+$-type region 29 and a resistor 30.

If it is assumed that a negative electric field is applied to the Si body 21 via the metal electrodes 23a, 23b, ..., 23n, 24a, 24b, ..., 24n, 25a, 25b, ..., 25n, a depletion region will be formed within the body. The larger the electric field applied, the more extensively the depletion region will grow until an inversion region is formed which is of an opposite conductivity with respect to the body 21. In the present invention, this depletion region must reach the surface of the substrate 20, and must also reach the side surface of the substrate. In other words, the thickness T of the semiconductor body 21 is less than the depth of the depletion region, and the width W of the semiconductor body 21 is less than the total width of the width of the electrode and twice the width of the depletion region spread from the electrode.

Under the influence of an electric field having a strength sufficient to produce a depletion region 32 in the semiconductor body 21 applied to the electrodes 23a, 23b, ..., 23n; 24a, 24b, ..., 24n; and 25a, 25b, ..., 25n in a well-timed relationship, majority carriers introduced into the semiconductor body 21 are transferred from the input means 26 to the output means 28.

Namely, when the potentials of the applied voltages to the electrodes 23a, 23b, ..., 23n; 24a, 24b, ..., 24n; and 25a, 25b, ..., 25n are $-V_1$, $-V_2$ and $-V_3$, respectively, and the relation between the potentials is $V_1 > V_2 > V_3$, the depletion regions below the electrodes 23a, 23b, ..., 23n spread, so that the ends thereof reach the substrate 20, the depletion regions below the electrodes 24a, 24b, ..., 24n spread, so that the ends thereof do not reach the substrate 20, that is, the ends thereof are maintained intermediate the semiconductor body 21, and the depletion regions below the electrodes 25a, 25b, ..., 25n do not spread; therefore, majority carriers 31 in the semiconductor body 21 can be transferred from a portion within the semiconductor body 21 below the electrodes 24a, 24b, ..., 24n to a portion within the semiconductor body 21 below the electrodes 25a, 25b, ..., 25n. Next, when the relation between the potentials is changed to $V_2 > V_3 > V_1$, the depletion regions below the electrodes 24a, 24b, ..., 24n spread, so that the ends thereof reach the substrate 20, the depletion regions below the electrodes 25a, 25b, ..., 25n spread, so that the ends thereof do not reach the substrate 20, that is, the ends thereof are maintained intermediate of the semiconductor body 21, and the depletion regions below the electrodes 23a, 23b, ..., 23n do not spread; therefore, majority carriers 31 in the semiconductor body 21 can be transferred from the portions within the semiconductor body 21 below the electrodes 25a, 25b, ..., 25n, to the portions within the semiconductor body 21 below the electrodes 23b, ..., 23n.

By repeatedly applying voltages in the manner described above, it is possible to transfer majority carriers from electrode to electrode.

Figure 2:
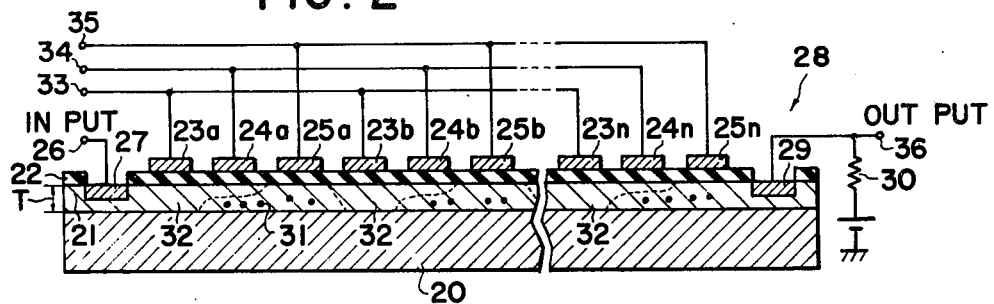
FIGS. 2 and 3 are longitudinal sectional and plan views of the present invention, for explaining the principles of the present invention.
Figure 3:
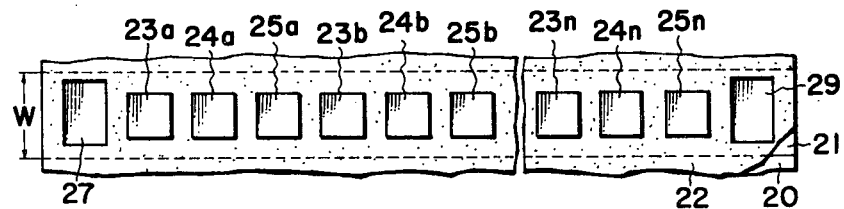

In FIGS. 2 and 3, the n-type Si body 21 is covered on one main surface with the insulating layer 22, and a series of electrodes 23a, 23b, ..., 23n, 24a, 24b, ..., 24n, 25a, 25b, ..., 25n are disposed over the insulating layer 22. These electrodes are arranged in trios of 23a, 24a, 25a up to the last trio of 23n, 24n, 25n. Conductors 33, 34, 35 are respectively connected to every third electrode. The input means, that is, majority carrier generating means, indicated at 26, includes $n^+$-region 27 for ohmically connecting an electric source (not shown) thereto. The majority carriers 31, produced at the generating means 26 move within the semiconductor body 21 when an electric field of such strength which does not produce an inversion region, but creates only a depletion region, in the Si body 21, whose thickness T is less than the depth of the depletion region and width W is less than the total width of the electrode and twice of the width of the depletion region spread from the electrode, is applied to the body 21, in a well-timed relationship through the conductors 33, 34, 35 and the electrodes 23a, 23b, ..., 23n, 24a, 24b, ..., 24n, 25a, 25b, ..., 25n. The majority carriers are extracted from an output terminal 36 via the $n^+$-region 29.

Means for generating the majority carriers, the means and method for extracting the majority carriers may be the same as those adopted for the conventional charge coupled semiconductor devices. A particular useful means and method are disclosed in U.S. patent application Ser. No. 11,541 assigned to Bell Telephone Laboratories, Inc. Of course, the elements of the generating and detecting means must be connected with the appropriate polarities since majority carriers, rather than minority carriers, are being transferred.

In the present invention, since the majority carriers are pushed out from the portion below one electrode to the portion below the electrode next to the one electrode, and cannot remain in the portion below the one electrode, the charge transfer semiconductor device of the present invention does not have a problem caused by a potential barrier between the electrodes in the conventional charge coupled semiconductor devices. Also, since the majority carriers are transferred within the semiconductor body, the majority carriers as a signal are not influenced by traps existing at the interface between the semiconductor body and the insulating layer. Moreover, the mobility of the carriers within the semiconductor body is about twice that at the surface of the semiconductor body; therefore, the transfer velocity of the carriers in the charge transfer semiconductor device of the present invention becomes high.

By the reasons as described above, transfer efficiency of the charge transfer semiconductor device according to the present invention is high compared with that of the conventional charge coupled semiconductor devices.

Concrete dimensions and materials of the charge transfer semiconductor device shown in FIGS. 2 and 3 are as follows:

The substrate 20 is of a single crystal sapphire ($\alpha$-$Al_2O_3$), the semiconductor body 21 is of n-type Si having a specific resistance of about 10$\Omega$cm, whose thickness is about 2 microns, and width is about 54 microns, the insulating layer 22 is of $SiO_2$ of about 1000 – 2000 A in thickness, and the electrode is of Al about 2000 –

3000 A in thickness, about 10 microns in length toward a direction to which the majority carriers are transferred, and about 50 microns in length toward a direction perpendicular to the direction to which the majority carriers are transferred.

The dimension and materials of the present invention are not limited to those described above. For example, as to the thickness and the width of the semiconductor body, these are not limited to 2 microns and 54 microns, since the depth or width of the depletion region is varied according to the material of the semiconductor body, the specific resistance of the semiconductor body and the voltage applied to the electrodes for transferring the majority carriers.

The following Table I shows a depth (microns) of the depletion region in connection with the impurity concentration (cm$^{-3}$) of the silicon body and the voltage (V) applied to the electrodes for transferring the majority carriers.

TABLE I

| IMPURITY CONCENTRATION | DEPLETION REGION DEPTH ($\mu$) | | | | |
| --- | --- | --- | --- | --- | --- |
| $1 \times 10^{14}$ | 7.9 | 11 | 16 | 19 | 22 |
| $5 \times 10^{14}$ | 3.5 | 5 | 7.1 | 8.6 | 9.9 |
| $1 \times 10^{15}$ | 2.5 | 3.5 | 5 | 6.1 | 7 |
| $5 \times 10^{15}$ | 1.1 | 1.6 | 2.3 | 2.7 | 3.1 |
| $1 \times 10^{16}$ | 0.79 | 1.1 | 1.6 | 1.9 | 2.2 |
| $5 \times 10^{16}$ | 0.35 | 0.5 | 0.71 | 0.86 | 0.99 |
| $1 \times 10^{17}$ | 0.25 | 0.35 | 0.5 | 0.61 | 0.7 |
| | 5 V | 10 V | 20 V | 30 V | 40 V |

APPLIED VOLTAGE

It is convenient for the fabrication of the charge transfer semiconductor device to form the width W of the semiconductor body less than the width of the electrode.

As to the substrate, although a single crystal of sapphire ($\alpha$- Al$_2$O$_3$) is utilized, any material which can be electrically isolated from the semiconductor body is utilized as the substrate. For example, when the semiconductor body is of n-type, p-type semiconductor material is utilized as the substrate which is electrically isolated from the semiconductor body by applying a reverse bias to a p-n junction formed between the substrate and the semiconductor body.

As to the semiconductor body, it need not be limited to a semiconductor material having a single crystalline state, but may be one having a polycrystalline state. When a polycrystalline semiconductor material is utilized as the semiconductor body, insulating materials, such as quartz, glass, etc. may be utilized as the substrate, and the charge transfer semiconductor device is easily fabricated as compared with that utilizing the single crystal semiconductor body.

The charge transfer semiconductor device shown in FIGS. 2 and 3 is fabricated by utilizing conventional steps of fabricating semiconductor devices, such as the epitaxial growth step, oxidation, etching, deposition, etc.

After preparing a single crystal of sapphire, the single crystal of Si is formed on the sapphire by contacting SiCl$_4$ gas entrained on H$_2$ gas which is heated at about 900° C. with the sapphire for 2 minutes. The surface of the epitaxially grown Si is oxidized by heating the surface thereof at a temperature of about 1050° C. for 70 minutes in an atmosphere of dry O$_2$. On the SiO$_2$ layer, Al is deposited at a temperature of about 100° C., and thus deposited Al is selectively etched so as to obtain the series of electrodes. Portions of the SiO$_2$ layer near the first and the last electrodes of the series of electrodes are etched away thereby exposing the surface of the Si body, and then impurities whose conductivity type is same as that of the Si body are diffused into the Si body from the exposed surface of the Si body.

In the charge transfer semiconductor device shown in FIGS. 2 and 3, though the electrodes are disposed on the insulating layer, when the electrode is electrically isolated from the substrate, any electrode means can be utilized.

Figure 4:
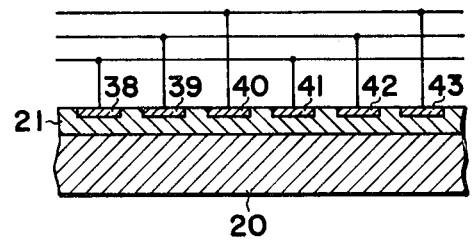
FIGS. 4 and 5 are views illustrating further embodiments of the present invention.

In FIG. 4, another electrode arrangement is shown. That is, p-type regions 38, 39, 40, 41, 42, 43 are disposed in the n-type semiconductor body 21, which are connected to the conductors 33, 34, 35, and which have a thickness of about 1 micron and a specific resistance of about 0.01 $\Omega$ cm. Between the p-type regions 38, 39, 40, 41, 42, 43 and the semiconductor body 21, p-n junctions are formed; therefore, the majority carriers within the semiconductor body 21 cannot break into the p-type regions 38, 39, 40, 41, 42, 43.

Figure 5:
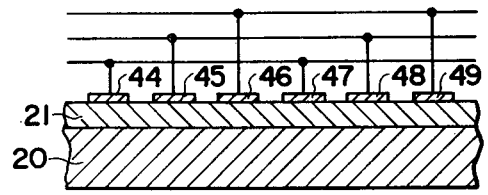

FIG. 5 is a sectional view of further electrode means, in which metal electrodes 44, 45, 46, 47, 48, 49 capable of forming Schottky barriers with the semiconductor body 21, for example, Mo is disposed on the semiconductor body 21, whose thickness is about 1000 – 2000 A. Since Schottky barriers are formed between the electrodes 44, 45 . . . , 49 and the semiconductor body 21, the majority carriers in the semiconductor body 21 cannot break into the electrodes 44, 45, . . . , 49.

In the charge transfer semiconductor device having the electrode means shown in FIGS. 4 and 5, it is not necessary to utilize the insulating layer 22 in the charge transfer semiconductor device shown in FIG. 2; hence, the fabrication of the charge transfer semiconductor device having such electrode means shown in FIGS. 4 and 5 is easier than that of the charge transfer semiconductor device shown in FIG. 2.

Figure 6:
FIG. 6 is a view illustrating a further embodiment of the present invention.

FIG. 6 shows another embodiment of the present invention, wherein numeral 50 denotes a substrate of quartz, numeral 51 denotes polycrystalline Si disposed on the quartz substrate 50, numerals 53a, 54a, 55a, 53b, 55b, . . . , 53n, 54n, 55n denote metal electrodes disposed on an insulating layer 52 which is disposed on the surface of the polycrystalline Si 51, numerals 56 and 57 denote electrodes ohmically disposed on the polycrystalline Si 51 for introducing majority carriers, that is, a signal, into the polycrystalline Si 51 and for detecting the signal, respectively, and numerals 58 and 59 denote gate electrodes for controlling an amount of majority carriers transferred within the polycrystalline Si 51 and for supressing noise caused by the transfer voltages, respectively.

The embodiment shown in FIG. 6 functions as follows:

Majority carriers are introduced into the polycrystalline Si 51 by applying signal voltage to the polycrystalline Si 51 through the electrode 56, and the amount of the majority carriers is controlled by applying a voltage through the gate electrode 58. Majority carriers of a controlled amount are transferred by applying transfer voltages to the electrodes 53a, 54a, 55a, . . . , 53n, 54n, 55n in a well-timed relationship. Thus, transferred majority carriers are detected through the electrode 57.

The charge transfer semiconductor device of the embodiment described above is formed as follows:

After preparing the quartz substrate by sputtering or depositing Si by electron beam, or thermal decomposition of a mixed gas of $SiH_4$ and $PH_3$ at a temperature of about 900°C., on the polycrystalline Si thus formed, an $SiO_2$ layer is formed by thermal decomposition of $SiH_4$ in an atmosphere of $O_2$ at a temperature of about 400°C. Then, on the $SiO_2$ layer, Al or Au is deposited and the deposited Al or Au is selectively etched for fabricating the series of electrodes. Portions of the $SiO_2$ layer near the first and the last electrodes of the series of electrodes are etched away, thereby exposing the surface of the polycrystalline Si, and then, on the exposed surface of the polycrystalline Si, metal electrodes are deposited.

In the above-mentioned embodiment, although the majority carriers are transferred by applying transferring voltages to the electrodes disposed on the insulating layer 52, electrodes disposed within the insulating layer can be utilized.

Figure 7:
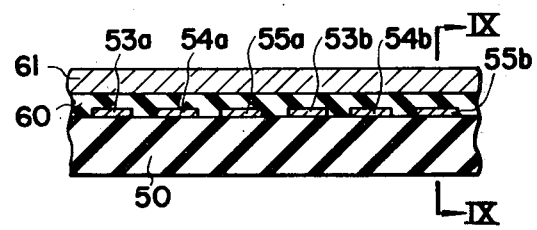
FIG. 7 to 13 are views illustrating still further embodiments of the present invention.
Figure 8:
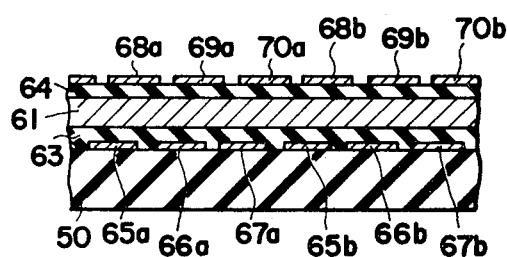
Figure 9:
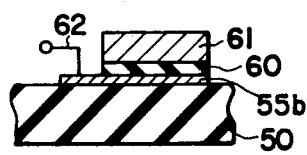

FIGS. 7, 8 and 9 show other electrode means for transferring the majority carriers.

In FIG. 7, electrodes 53a, 54a, 55a, 53b, 54b, 55b are disposed within the insulating layer 60 disposed on the quartz substrate 50, and a polycrystalline Si is disposed on the insulating layer 60. A cross-section of the device shown in FIG. 7 at the line IX—IX is shown in FIG. 9, in which a conductor 62 is connected to the electrode protruding from the insulating layer 60.

FIG. 8 is a sectional view of other electrode means, which are the combination of the devices shown in FIGS. 6 and 7. A first series of electrodes 65a, 66a, 67a, 65b, 66b, 67b, . . . are disposed within the first insulating layer 63 disposed on the quartz substrate 50 and a second series of electrodes 68a, 69a, 70a, 68b, 69b, 70b, . . . are disposed on the second insulating layer 64 disposed on the polycrystalline Si 61 which is disposed on the first insulating layer 63. Both series of electrodes 65a, 66a, 67a, 66b, 67b, . . . ; and 68a, 69a, 70a, 68b, 69b, 70b, . . . are so arranged that the ends thereof overlap each other.

In the charge transfer semiconductor device having the electrode means shown in FIG. 8, majority carriers are transferred in a zigzag form within the polycrystalline Si 61.

Figure 10:
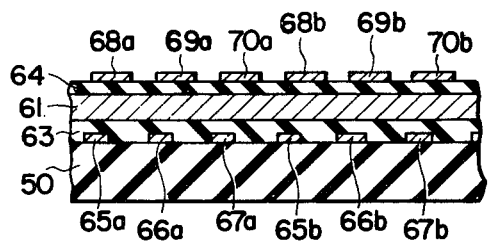

FIG. 10 is a sectional view of modified electrode means shown in FIG. 8, wherein the first series of electrodes 65a, 66a, 67a, 65b, 66b, 67b, . . . and the second series of electrodes 68a, 69a, 70a, 68b, 69b, 70b, . . . have different respective lengths and are arranged so that the one part of the electrode does not overlap.

Figure 11:
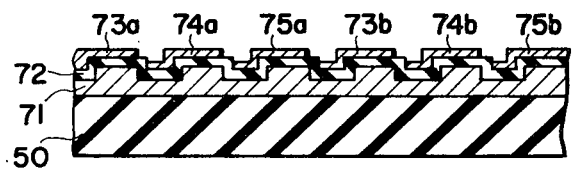

FIG. 11 shows another electrode means, in which a polycrystalline Si 71 disposed on the quartz substrate 50 has a structure having periodically different thicknesses, an insulating layer 72 is disposed on the polycrystalline Si 71, and metal layers 73a, 74a, 75a, 73b, 74b, 75b, . . . are disposed on the insulating layer 72 so that at least a part of the metal layer covers the insulating layer disposed on the thin polycrystalline Si 71.

Figure 12:
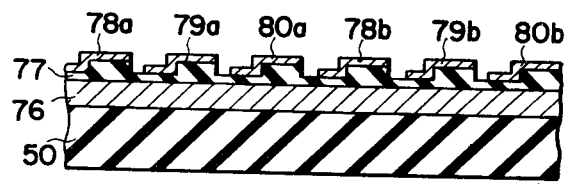

FIG. 12 is a sectional view of other electrode means, in which a polycrystalline Si 76 disposed on the quartz substrate 50 has a uniform thickness, and an insulating layer 77 disposed on the polycrystalline Si 76 has a structure having periodically different thicknesses. In this electrode means, metal layers 78a, 79a, 80a, 78b, 79b, 80b, . . . have the same structure as that of the metal layers shown in FIG. 11.

By utilizing these electrode means shown in FIGS. 10, 11 and 12, in the charge transfer semiconductor device, it becomes possible to transfer the majority carriers by applying two phase pulsed voltage to the electrode means.

Figure 13:
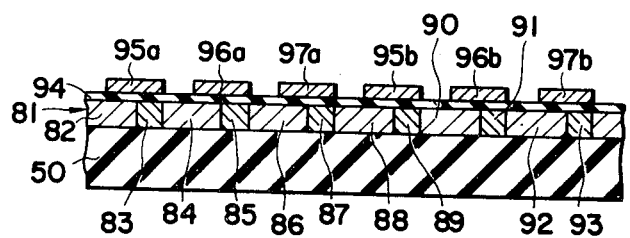

FIG. 13 is a sectional view of further electrode means, wherein a polycrystalline Si 81 having alternatively different impurity concentration regions 82, 83, 84, 85, 86, 87, 88, 89, 90, 91, 92, 93, . . . is disposed on the quartz substrate 50, an insulating layer 94 is disposed on the polycrystalline Si 81, and metal layers 95a, 96a, 97a, 95b, 96b, 97b, . . . are disposed on the insulating layer 81 so that the metal layer alternately overlaps the boundary between the different impurity concentration regions in the polycrystalline Si 81.

Figure 14:
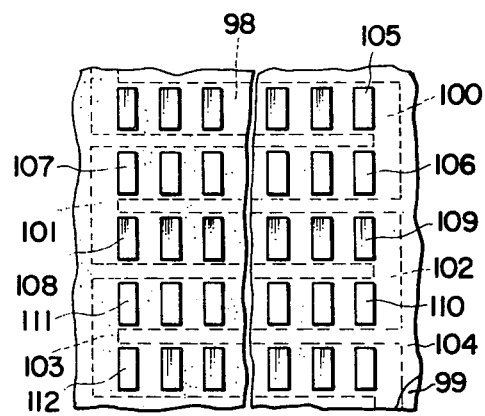
FIGS. 14 to 19 are views illustrating further embodiments of the present invention.

FIG. 14 is a plan view of another embodiment of the present invention, wherein a semiconductor body 98 is turned at the end of the substrate 99. At the turned portions 100, 101, 102, 103, . . . no electrodes are disposed on an insulating layer 104.

In this embodiment, the turned portions 100, 101, 102, 103, . . . function only as conductive regions, since the majority carriers are transferred. Therefore, the portions of the semiconductor body between the electrodes 105, and 106; 107 and 108; 109 and 110; 111 and 112; . . . are turned as shown in FIG. 14, the majority carriers transferred below the electrodes 105, 107, 109, 111, . . . pass through the turned portions 100, 101, 102, 103, . . . and are turned to the transferring direction, and are transferred below the electrodes 106, 108, 110, 112, . . . . In this case, though the majority carriers pushed out from below the electrodes 105, 107, 109, 111, . . . are not always transferred to below the electrodes 106, 108, 110, 112, . . . in that condition, but are sometimes transferred with majority carriers in the turned portions, the signal is not substantially influenced by the majority carriers in the turned portions.

For improving the conductivity of the turned portions, in the turned portions, higher impurity concentration regions than that of the turned portions are disposed.

Figure 15:
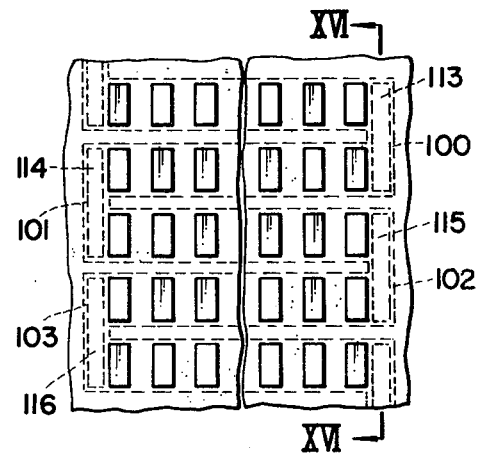
Figure 16:
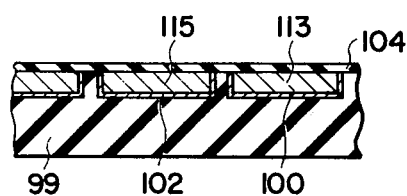

In FIGS. 15 and 16, other turned portions are shown. FIG. 16 is a sectional view of FIG. 15 along the line XVI—XVI.

In the turned portions 10. 101, 102, 103 . . . regions 113, 114, 115, 116, . . . of a higher impurity concentration than that of the turned portions 100, 101, 102, 103, . . . whose conductivity type is the same as that of the turned portion are disposed.

Figure 17:
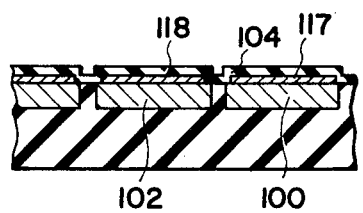

FIG. 17 shows a sectional view of a further turned portion, wherein metal layers 117, 118, . . . are disposed on the turned portions 100, 102, . . . instead of the high impurity concentration regions 113, 114, 115, 116, . . .

Though no electrodes are disposed on the insulating layer in FIGS. 14 and 15, electrodes may be disposed over the turned portions.

Figure 18:
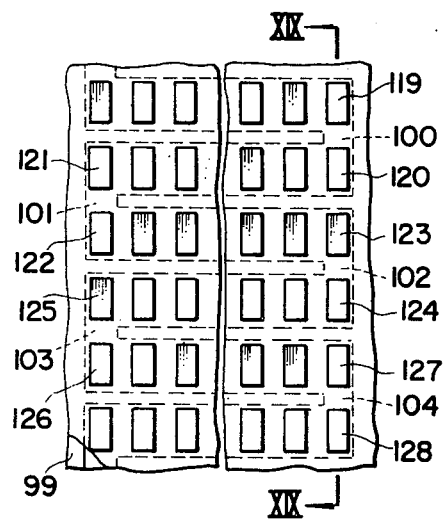
Figure 19:
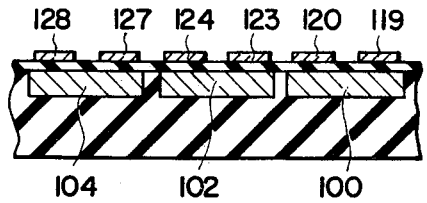

In FIGS. 18 and 19, one example of the turned portions over which electrodes are disposed is shown. FIG. 19 is a sectional view of FIG. 18 cut along the line C—C.

As shown in FIGS. 18 and 19, electrodes 119, 120, 121, 122, 123, 124, 125, 126, 127, 128, . . . are disposed over the turned portions 100, 101, 102, 103, 104, . . . .

In the charge transfer semiconductor device, the output signal is very weak. Therefore, it is useful for the charge transfer semiconductor device to provide an amplifying means therein.

Figure 20:
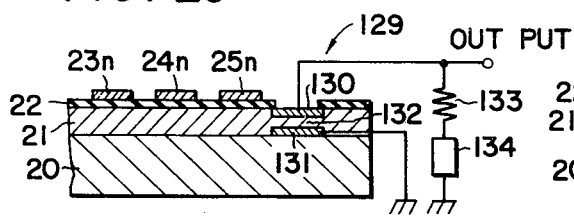
FIGS. 20 to 28 are views illustrating further embodiments of the present invention, for explaining the detection of the output signal.

FIG. 20 shows a sectional view of one embodiment of the present invention which has the amplifying means, that is, a transistor. In other words, the output means 28 in FIG. 2 is replaced by a transistor.

An output means 129 if FIG. 20 comprises p-type regions 130 and 131 disposed in the semiconductor body 21 so as to be separated from each other by the body 21 as shown in FIG. 20.

The majority carriers transferred within the semiconductor body 21 are introduced into a base region 132 which is a part of the semiconductor body 21 and which is situated between the p-type regions 130 and 131 and, through a resistor 133 connected to one of the p-type regions 130 and 131, an output of the introduced majority carriers as a signal is detected.

As is well known in the transistor field, when the resistor is connected to an emitter region, the transistors are utilized as an emitter follower; therefore, the output can be detected in a low output impedance, and when the resistor is connected to a collector region, an amplified output can be obtained.

In FIG. 20, a numeral 134 depicts bias applying means, and the output means is utilized as the emitter follower.

Although the output means is a lateral type transistor in FIG. 20, planar-type transistors and MOS-type transistors can be utilized.

Figure 21:
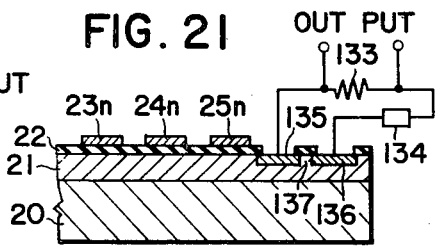

FIG. 21 shows a sectional view of another embodiment of the output means wherein a planar-type transistor is utilized.

The planar-type transistor in this FIG. comprises two p-type regions 135 and 136 separated by a part 137 of the semiconductor body 21, and disposed in the semiconductor body 21 so that the surfaces of p-type regions 135 and 136 are exposed on the surface of the semiconductor body 21.

Figure 22:
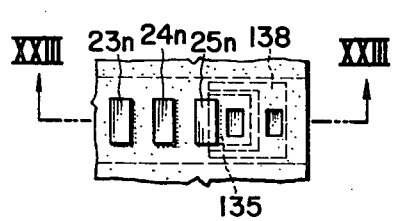
Figure 23:
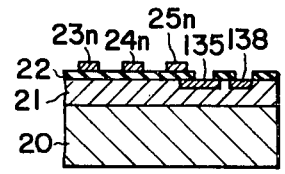

When the emitter region is surrounded by the collector region, the transferred majority carriers are more efficiently introduced into the base region as compared with the device wherein the emitter region and the collector region is laterally disposed. FIGs. 22 and 23 show a plan view and a sectional view of another output means of the present invention, respectively. FIG. 23 is a view cut along a line XXIII—XXIII of the device shown in FIG. 22.

In the figures, about three-quarters of emitter region 135 is surrounded by a collector region 138.

Figure 24:
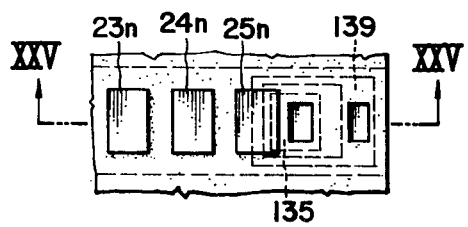
Figure 25:
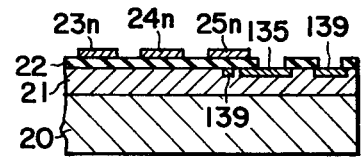

FIGS. 24 and 25 show a plan view and a sectional view of further output means of the present invention. FIG. 25 is a view cut along a line XXV—XXV of the device shown in FIG. 24.

In the figures, the emitter region 135 is completely surrounded by a collector region 139.

Although, in the above described output means, p-n junctions are utilized, Schottky junctions may be utilized.

Figure 26:
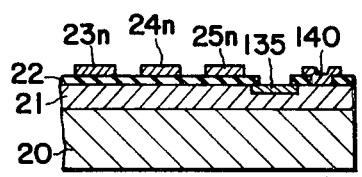

FIG. 26 shows a sectional view of another output means of the present invention.

In the figure, Mo layer 140 is disposed on a part of the semiconductor body 21 which corresponds to the emitter region in FIG. 21, thereby a Schottky junction is formed between Mo layer 140 and the semiconductor body 21. The function of this output means is same as the output means shown in FIG. 21.

As described before MOS-type transistors can be utilized as output detecting means.

Figure 27:
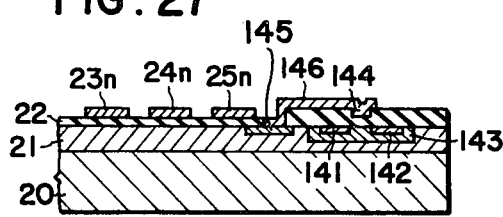
Figure 28:
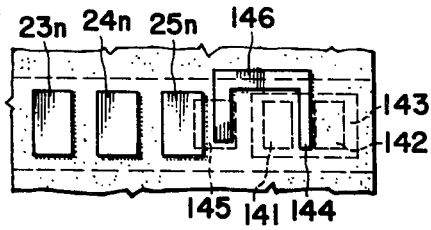

FIGS. 27 and 28 show a sectional view and a plan view of other output detecting means of the present invention.

At the end of the charge transfer semiconductor device, an MOS-type transistor comprising source and drain regions 141 and 142 disposed in a p-type region 143 which is disposed in the semiconductor body 21 and separated from each other, and a gate electrode 144 disposed over a portion between the source and drain regions are provided. To the gate electrode 144, a higher impurity concentration region 145 as compared with that of the semiconductor body 21, disposed in the semiconductor body 21, is connected by a conductor 146.

Majority carriers transferred within the semiconductor body 21 are introduced into the high impurity concentration region 145, and a signal caused by the introduced majority carriers is transmitted to the gate electrode 144 through the conductor 146. The signal transmitted to the gate electrode 144 is amplified by the MOS-type transistor as the output detecting means.

Majority carriers can be detected through the transit thereof.

Figure 29:
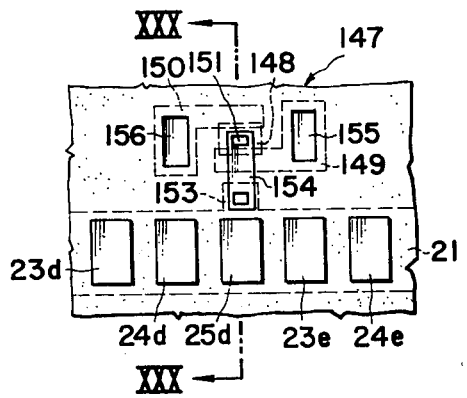
FIGS. 29 to 31 are views illustrating further embodiments of the present invention, for explaining the detection of the majority carriers as a signal by way of the transit.
Figure 30:
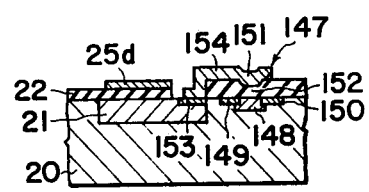

FIGS. 29 and 30 show a plan view and a sectional view of one embodiment of detecting means of the majority carriers through transit. FIG. 30 shows a sectional view of the device cut along a line XXX—XXX shown in FIG. 29.

In the FIGS. 29 and 30, an MOS-type transistor 147 is disposed in the substrate 20 adjacent an electrode 25d below which the transferred majority carriers are to be detected. The MOS-type transistor 147 comprises an n-type region 148 disposed in the substrate 20, $n^+$-type regions 149 and 150 disposed in the substrate 20, so that one edge of the regions 149 and 150 is contacted to the n-type region 148 as shown in FIG. 30, and a gate electrode 151 contacting the n-type region 148 between the $n^+$-type regions 149 and 150 through an insulating layer 152. The gate electrode 151 is connected to an $N^+$-type region 153, disposed in the semiconductor body 21 adjacent the electrode 25d below which the transferred majority carriers are to be detected, through a conductor 154.

In FIG. 29, numerals 155 and 156 depict source and drain electrodes, respectively.

Figure 31:
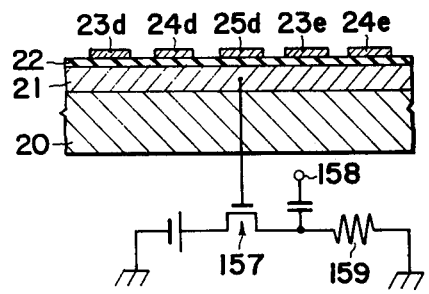
Figure 32:
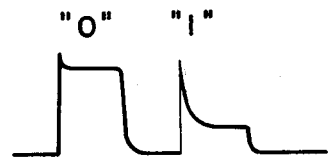
FIG. 32 shows an output signal detected by the embodiment shown in FIG. 30.

A function of the device shown in FIGS. 29 and 30 is described in detail according to FIGS. 31 and 32.

FIG. 31 shows a sectional view and a circuit diagram of the device shown in FIGS. 29 and 30, wherein a numeral 157 depicts a MOS-type transistor which corresponds to the MOS-type transistor 147 shown in FIGS. 29 and 30.

When a pulse voltage is applied to the electrode 25d, the electric potential of the semiconductor body 21 below the electrode 25d becomes higher than that below the electrodes 24d and 23e. Therefore, when the majority carriers exist at the portion in the semiconductor body 21 below the electrode 24d, the majority carriers are transferred to the portion in the semiconductor body below the electrode 25d, and the electric potential below the electrode 25d becomes lower according to the amount of the majority carriers.

The electric potential at the portion below the electrode 25d is applied to the gate electrode 151 through the $n^+$-type region 153 and the conductor 154.

When the majority carriers are not transferred below the electrode 25d ("O" as a signal), the potential below the electrode 25d is in a "high" state. Therefore, MOS-type transistor 157 is turned "ON", and an electric current flows in the MOS-type transistor 157, whereby a voltage at an output terminal 158 is changed to a certain value for a potential drop caused by a resistor 159, and kept at the certain value during the application of the voltage to the electrode 25d. At this stage, the electric potential at the source region 155 is determined by the resistor 159, the channel resistance of the MOS type transistor 157 and the drain-bias. Usually, the varying amount of the potential at the source region 155 is more than several volts.

When the majority carriers are transferred below the electrode 25d ("1" as a signal), the potential below the electrode 25d which is "high", first by applying the voltage to the electrode 25d, decreases according to the amount of the majority carriers. This potential is transmitted to the gate electrode 151, and an electric current in response to the gate voltage, that is, the current responsive to the amount of the majority carriers, flows in MOS-type transistor 157 and the resistor 159.

As described above, output signals can be detected at the output terminal 158. The output signals are shown in FIG. 32. The left side of the FIG. shows a "O" state signal, that is, the signal where no majority carriers are transferred below the electrode 25d, and the right side of the figure shows a "1" state signal, that is, a signal where the majority carriers are transferred below the electrode 25d. A spike portion of the "1" state signal can be removed easily by a low pass filter.

Although a particular type of the MOS-type transistor is used in the above-mentioned embodiment as the output detecting means, for the transit of the majority carriers, it may be replaced by another type of MOS-type transistors.

Figure 33:
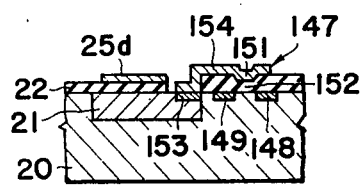
FIGS. 33 to 36 are views of further embodiments of the present invention for explaining the detection of the majority carriers as a signal by way of the transit.
Figure 34:
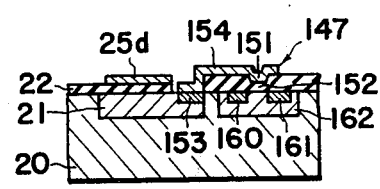

FIGS. 33 and 34 show sectional views of other output detecting means.

In FIG. 33, no n-type region 148 shown in FIG. 30 is disposed in the substrate 20. In FIG. 34, p-type source and drain regions 160 and 161 are disposed in the n-type region 162 so that both regions are separated by a part of the n-type region 162, that is a p-channel MOS transistor.

Figure 35:
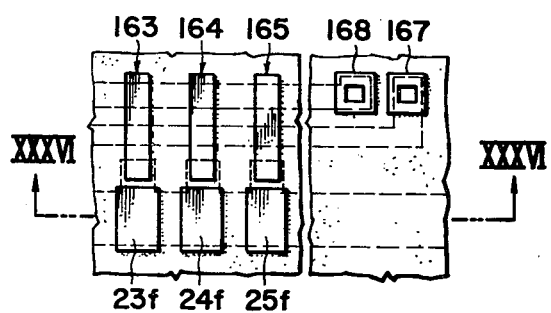
Figure 36:
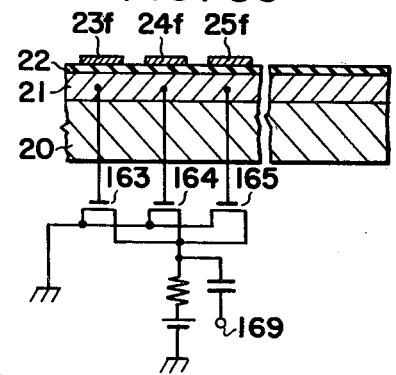

FIGS. 35 and 36 show a plan view and a sectional view of other output detecting means of the present invention, wherein three MOS-type transistors 163, 164, 165 are disposed adjacent electrodes 23f, 24f, 25f, respectively.

FIG. 36 is the sectional view cut along a line XXXVI—XXXVI in FIG. 35.

Only one third of the wave form of the output signal detected by the output detecting means is shown in Figure in FIG. 29 since there is only one MOS-type transistor for detecting majority carriers, and the transferring voltage is a three phase pulsed voltage.

It is desirable, for a charge transfer semiconductor device for transferring analog signals, that the wave form is continuous. FIGS. 35 and 36 are the device from which relatively continuous output signals are obtained.

In the device shown in FIGS. 35 and 36, as described above, MOS-type transistors 163, 164, 165 are disposed adjacent the transferring electrodes 23f, 24f 25f, respectively. Source regions and drain regions of the MOS-type transistors are disposed in common, and they have a source electrode 167 and a drain electrode 168.

A circuit diagram of the device shown in FIG. 35 is shown in FIG. 36.

When the majority carriers are transferred by three phase pulsed voltages applied to the electrodes 23f, 24f, 25f a signal at the MOS-type transistor 163 is transferred to the MOS-type transistor 164 with a phase difference of 120°. Therefore, though the signal is not at the MOS-type transistor 163, the potential at an output terminal 169 is maintained at a constant value. The same input is applied to the MOS-type transistor 165, hence the potential of the constant value is maintained until a new signal is introduced into the MOS-type transistor 163.

According as the transit of the majority carriers, the amount of a the output signal varies slightly, hence, it is desirable and is easily possible to make the amount of the output signal constant by slightly changing the width of the gate region.

Figure 37A:
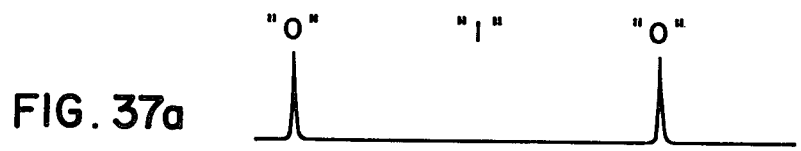
FIGS. 37a–37c show output signals detected by the embodiments shown in FIGS. 2, 31 and 36.
Figure 37B:
Figure 37C:
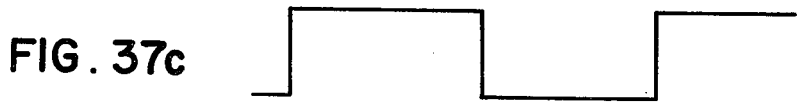

FIGS. 37a – 37c show diagrams of the output signals detected by the charge transfer semiconductor devices shown in FIG. 2, FIG. 29 and FIG. 36. FIG. 37a shows a diagram of the output signal detected by the charge transfer semiconductor device shown in FIG. 2, FIG. 37b shows a diagram of the output signal detected by the charge transfer semiconductor device shown in FIG. 29, and FIG. 37c shows diagram of the output signal detected by the charge transfer semiconductor device shown in FIG. 36.

The output signal of the charge transfer semiconductor device shown in FIG. 2 has a spike-shaped wave form when no majority carriers are transferred, that is "O" state signal, as shown in FIG. 37a.

The output signal of the charge transfer semiconductor device shown in FIG. 29 has a wave form whose pulse width is wider than that of the device shown in FIG. 2.

The output signal of the charge transfer semiconductor device shown in FIG. 36 has a wave form whose pulse width is about three times as that of the device shown in FIG. 29.

In the above mentioned charge transfer semiconductor devices, although they have many advantages when compared with the conventional charge coupled semiconductor devices, they have such disadvantages that the transferring efficiency is not highly improved, since the semiconductor body below the gap between the electrodes is not completely depleted.

Figure 38:
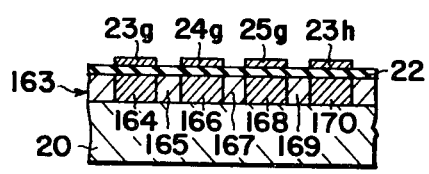
FIGS. 38–42 are views illustrating still further embodiments of the present invention.

FIG. 38 shows a sectional view of one embodiment of the present invention, which has a structure wherein the majority carriers do not remain at a portion in the semiconductor body below the gap between the electrodes.

In FIG. 38, on the substrate 20, a semiconductor body 163 having a first semiconductor regions 164, 166, 168, 170, . . .and second semiconductor regions 165,167,169, . . . whose impurity concentration is lower than and conductivity type is the same as that of the first semiconductor regions 164, 166, 168, 170, . . . which are arranged alternately with each other, is disposed. An insulating layer 22 is disposed on the semiconductor body 163, and electrodes 23g, 24g, 25g, 23h, . . . are disposed on the portions of the insulating layer 22 corresponding to the first semiconductor regions 164, 166, 168, 170 respectively.

When the transferring voltage is applied to one of the electrodes 23g, 24g, 25g, 23h, . . . for depleting one of the semiconductor regions 164, 166, 168, 170, . . . a depletion region created in the semiconductor body 163 by the applied voltages extends easily toward the direction of the gap between the electrodes as compared with the direction of the substrate 20, since the impurity concentration of the first semiconductor regions is higher than that in the second semiconductor regions.

Therefore, the semiconductor body corresponding to the gap between the electrodes is completely depleted and, hence, the transferring efficiency of the majority carriers is remarkably improved.

Figure 39:
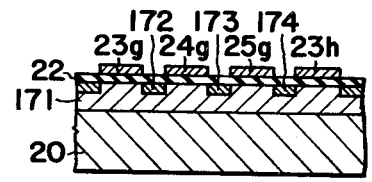
Figure 40:
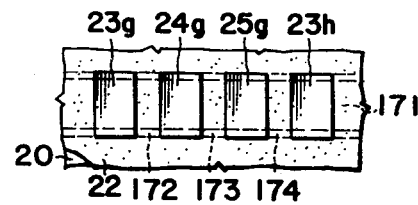

FIGS. 39 and 40 are a sectional view and a plan view of another embodiment of the present invention, which has a structure wherein the majority carriers do not remain at a portion in the semiconductor body below the gap between the electrodes.

In FIGS. 39 and 40, on the substrate 20, a semiconductor body 171 having semiconductor regions 172, 173, 174, . . . whose conductivity type is opposite to that of the semiconductor body 171, is disposed in the body 171, so that the semiconductor regions 172, 173, 174, . . . are alternately arranged as shown in FIG. 39. The insulating layer 22 is disposed on the semiconductor body 171, and the electrodes 23g, 24g, 25g, 23h, . . . are disposed on the portion of the insulating layer 22 corresponding to the gaps between the semiconductor regions 172, 173, 174, . . . respectively.

The semiconductor regions 172, 173, 174, . . . are connected to the substrate 20 and, hence, the potential of the semiconductor regions 172, 173, 174, . . . is the same as that of the substrate 20. Usually, as the substrate, a semiconductor material whose conductivity type is opposite to that of the semiconductor body 171 is utilized, and then a reverse bias is applied to a p-n junction formed between the substrate and the semiconductor body. Therefore, a p-n junction between the semiconductor body 171 and the semiconductor regions 172, 173, 174, . . . is reversely biased; hence, a depletion region is formed around the p-n junction between the semiconductor body 171 and the semiconductor regions 172, 173, 174, . . . Because of the existance of the depletion region around the p-n junction between the semiconductor body 171 and the semiconductor regions 172, 173, 174, . . . the majority carriers are transferred completely within the semiconductor body 171 from a portion below one electrode to a portion below another electrode.

Figure 41:
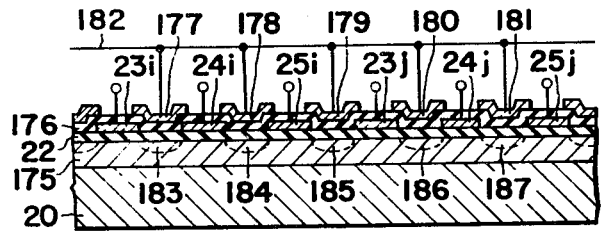

FIG. 41 shows a sectional view of a further embodiment of the present invention, which has a structure wherein the majority carriers do not remain at a portion in the semiconductor body below the gap between the electrodes.

In FIG. 41, on the semiconductor body 20, a semiconductor body 175 is disposed, insulating layer 22 is disposed on the semiconductor body 175, electrodes 23i, 24i, 25i, 23j, 24j, 25j, are separately disposed on the insulating layer 22, an insulating layer 176 is disposed on the electrodes 23i, 24i, 25i, 23j, 24j, 25j, . . . and the insulating layer 22, and electrodes 177, 178, 179, 180, 181, . . . are disposed at portions on the insulating layer 176 corresponding to the gaps between the electrodes 23i, 24i, 25i, 23j, 24j, 24j, . . . The electrodes 177, 178, 179, 180, 181, . . . are connected to each other through a conductor 182.

When a voltage is applied to the semiconductor body 175 through the conductor 182 and the electrodes 177, 178, 179, 180, 181, . . . depletion regions 183, 184, 185, 186, 187, . . . are formed in the surface portions of the semiconductor body 175 corresponding to the electrodes 177, 178, 179, 180, 181, . . . Therefore, nondepleted portions in the semiconductor body 175 between the electrodes 23i, 24i, 25i, 23j, 24j, 25j, . . . decrease; hence, the majority carriers are transferred within the semiconductor body 175 with a high transfer efficiency.

Figure 42:
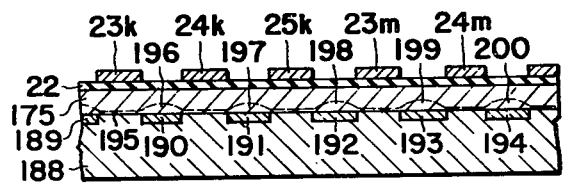

FIG. 42 shows a sectional view of a further embodiment of the present invention, which has a structure wherein the majority carriers do not remain at a portion in the semiconductor body below the gap between the electrodes.

In FIG. 42, the semiconductor body 175 is disposed on a semiconductor body 188, in which semiconductor regions 189, 190, 191, 192, 193, 194, . . . are disposed at the boundary between the body 175 and the substrate 188, the insulating layer 22 is disposed on the semiconductor body 175, and electrodes 23k, 24k, 25k, 23m, 24m, . . . are disposed at portions on the insulating layer 22 corresponding to the gaps between the semiconductor regions 189, 190, 191, 192, 193, 194, . . .

As described before, since a p-n junction between the semiconductor body 175 and the semiconductor substrate 188 is reversely biased for preventing the introduction of the majority carriers into the semiconductor substrate 188, a depletion region 195 is formed around the p-n junction between the semiconductor body 175 and the semiconductor substrate 188.

At the p-n junctions between the semiconductor body 175 and each of the semiconductor regions 190, 191, 192, 193, 194, . . . extended depletion regions 196, 197, 198, 199, 200, . . . are formed, since the semiconductor regions 190, 191, 192, 193, 194, . . . have higher impurity concentration than that of the semiconductor substrate. Therefore, nondepleted portion in the semiconductor body 175 between the electrodes 23k, 24k, 25k, 23m, 24m, . . . are decreased; hence, the majority carriers are transferred within the semiconductor body 175 with a high transfer efficiency.

The majority carriers in the charge transfer semiconductor devices as described above are transferred within the semiconductor body by applying principally three-phase pulsed voltages to the transferring electrodes; hence, driving systems for the charge transfer semiconductor devices become very complicated, multi-layer wirings are necessary and the integration density of the charge transfer semiconductor device becomes very low; hence, a large amount of electricity is consumed.

This problem is improved for transferring majority carriers by applying two phase pulsed voltages to a pair of electrodes.

Figure 43:
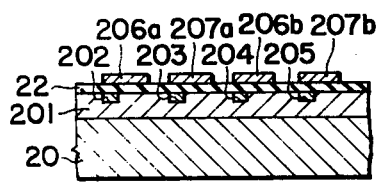
FIG. 43 shows still a further embodiment of the present invention.

FIG. 43 shows a sectional view of one embodiment of the present invention, wherein the majority carriers are transferred by two phase pulsed voltages.

In FIG. 43, on the substrate 20, a semiconductor body 201, having semiconductor regions 202, 203, 204, 205, . . . arranged evenly, whose conductivity type is opposite to that of the semiconductor body 201, is disposed, insulating layer 22 is disposed on the semiconductor body 201, and electrodes 206a, 207a, 206b, 207b, . . . are disposed on portions of the insulating layer 22 corresponding to the semiconductor regions 202, 203, 204, 205, . . . respectively, Each of the semiconductor regions 202, 203, 204, 205, . . . is disposed below the side of the electrode to which the majority carriers are not transferred.

Figure 44A:
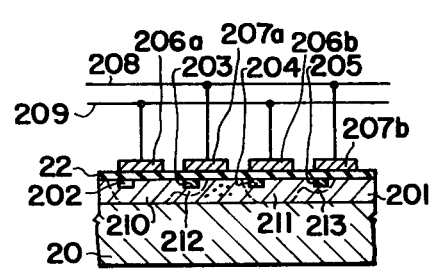
FIG. 44 is a view for explaining the principle of the transit of the embodiment shown in FIG. 43.
Figure 44B:
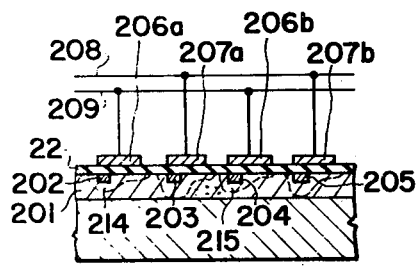
Figure 44C:
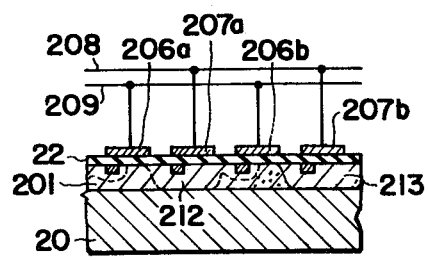

The function of the charge transfer semiconductor device is explained in detail by utilizing FIGS. 44a, 44b, and 44c.

Assuming now that a two phase pulsed voltage having -V and O is applied to the semiconductor body 201 through conductors 208 and 209 and the electrodes 206a, 206b; 207a, 207b; . . . , and voltages O and -V are applied to the electrodes 207a, 207b, . . . through the conductor 208, and to the electrodes 206a, 206b, . . . through the conductor 209, in the portions below the electrodes 206a, 206b, . . . depletion regions 210, 211, . . . are formed, and below the electrodes 207a, 207b, . . . depletion regions 212, 213, . . . are formed only around the semiconductor regions 203, 205, . . . This state is shown in FIG. 44a. At this stage, the majority carriers to be transferred are confined in the portions of the semiconductor body 201 below the electrodes 207a, 207b, . . .

Next, the voltage applied to the electrodes 207a, 207b, . . . is gradually lowered, the depletion regions 212, 213, . . . are gradually extended, and reach to the substrate 20. The voltage applied to the electrodes 206a, 206b, . . . is changed to 0, to depletion regions 210, 211, . . . below the electrodes 206a, 206b, . . . disappear, leaving depletion regions 214, 215, . . . This state is shown in FIG. 44b. In this state, a portion of the majority carriers is transferred toward the portions in the semiconductor body 201 below the electrodes 206b, . . . , no majority carriers are transferred toward the portions below the electrodes 206a, 206b, . . . since the depletion regions below the electrodes 207a, 207b, . . . reach the substrate 201.

Further, when the voltage applied to the electrodes 207a, 207b, . . . becomes to -V, portions in the semiconductor body 201 below the electrodes 207a, 207b, . . . are occupied completely by the depletion regions 212, 213, . . . ; hence, the majority carriers are transferred to the portions below the electrodes 206b, . . . This state is shown in FIG. 44c.

By repeatedly applying voltages to the electrodes in the manner as described above, the majority carriers are transferred within the semiconductor body from electrode to electrode.

Figure 45:
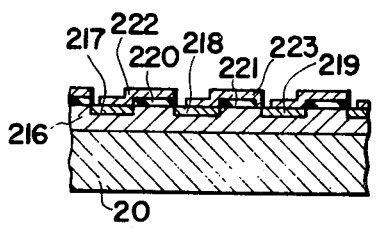
FIGS. 45 to 53 are views illustrating still further embodiments of the present invention.

FIG. 45 shows a sectional view of another embodiment of the present invention, wherein the majority carriers are transferred by two phase pulsed voltages.

In FIG. 45, on the substrate 20, a semiconductor body 216 having semiconductor regions 217, 218, 219, . . . whose conductivity type is opposite to that of the semiconductor body 216, arranged spacedly are disposed therein, insulating layers 220, 211, . . . are disposed between the semiconductor regions 217, 218, 219, . . . , and electrodes 222, 223, . . . disposed on the insulating layers 220, 221, . . . and the semiconductor regions 217, 218 , . . . as shown in FIG. 45.

Figure 46:
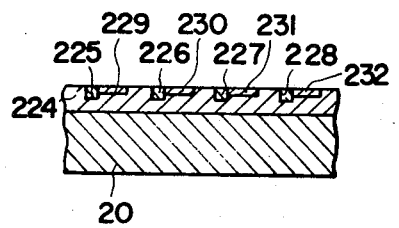

FIG. 46 shows a sectional view of further embodiment of the present invention, wherein the majority carriers are transferred by two phase pulsed voltages.

In FIG. 46, on the substrate 20, a semiconductor body 224 having first semiconductor regions 225, 226, 227, 228, . . . whose each conductivity type is opposite to that of the semiconductor body 224, are spacedly arranged therein, and second semiconductor regions 229, 230, 231, 232, . . . whose conductivity type is opposite to that of the semiconductor body 224, whose one side to which the majority carriers are not transferred is connected to said each first semiconductor region, and whose thickness is thinner than that of each semiconductor region, are disposed in the semiconductor body 224.

Figure 47:
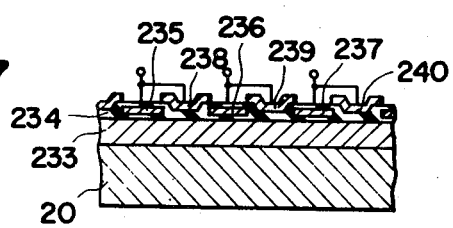

FIG. 47 shows a sectional view of further embodiment of the present invention, wherein the majority carriers are transferred by two phase pulsed voltages.

In FIG. 47, on the substrate 20, a semiconductor body 223 is disposed. An insulating layer 234 in which first electrodes 235, 236, 237, . . . are spacedly disposed, which is insulated from the semiconductor body 233 by a part of the insulating layer 234, and second electrodes 238, 239, 240, . . . are disposed between the first electrodes 235, 236, 237, . . . which is connected to the first electrode disposed at the side to which the majority carriers are transferred.

Figure 48:
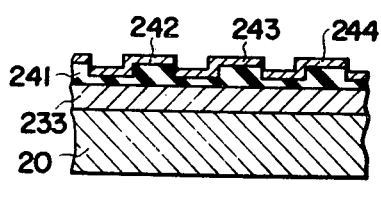

FIG. 48 shows a sectional view of further embodiment of the present invention, wherein the majority carriers are transferred by two phase pulsed voltages.

In FIG. 48, on the semiconductor body 233 disposed on the substrate 20, an insulating layer 241 whose thickness alternately varies is disposed, and electrodes 242, 243, 244, . . . are disposed so as to cover the thick and thin portions of the insulating layer 241.

Figure 49:
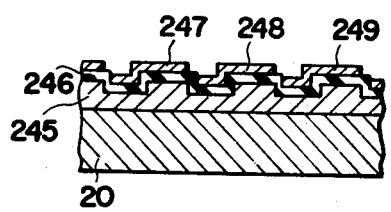

FIG. 49 shows a sectional view of further embodiment of the present invention, wherein majority carriers are transferred by two phase pulsed voltages.

In FIG. 49, on the substrate 20, a semiconductor body 245 having thick and thin portions periodically is disposed. An insulating layer 246 is disposed on the semiconductor body 245, and electrodes 247, 248, 249, . . . are disposed on the insulating layer 246, so as to cover a pair of thick and thin portions.

Figure 50:
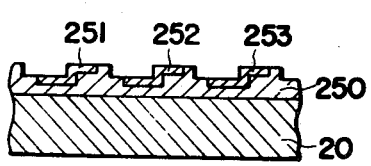

FIG. 50 shows a sectional view of further embodiment of the present invention, wherein the majority carriers are transferred by two phase pulsed voltages.

In FIG. 50, on the substrate 20, a semiconductor body 250 having thick and thin portions periodically is disposed. Semiconductor regions 251, 252, 253, . . . whose conductivity type is opposite to that of the semiconductor body 250 are disposed in the semiconductor body 250 so as to include surfaces of a pair of thin and thick portions.

Figure 51:
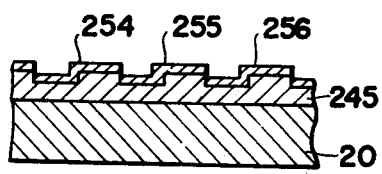

FIG. 51 shows a sectional view of further embodiment of the present invention, wherein the majority carriers are transferred by two phase pulsed voltages.

In FIG. 51, whose structure is similar to that of FIG. 49, metal electrodes 254, 255, 256, . . . which form Schottky barriers with the semiconductor body 245 are directly disposed on the semiconductor body 245.

Figure 52:
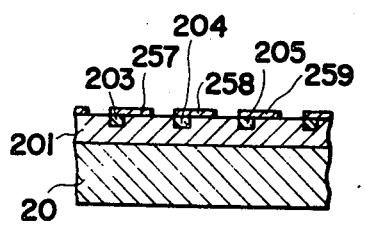

FIG. 52 shows a sectional view of further embodiment of the present invention, wherein the majority carriers are transferred by two phase pulsed voltages.

In FIG. 52 whose structure is similar to that of FIG. 43, metal electrodes 257, 258, 259, . . . which form Schottky barriers with the semiconductor body 201 and the semiconductor regions 202, 203, 204, . . . are directly disposed on the semiconductor body 201.

Figure 53:
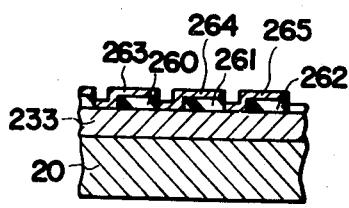

FIG. 53 shows a sectional view of further embodiment of the present invention, wherein the majority carriers are transferred by two phase pulsed voltages.

In FIG. 53, on the substrate 20, a semiconductor body 233 is disposed. Insulating layers 260, 261, 262, . . . are alternately and spacedly disposed on the semiconductor body 233, and metal electrodes 263, 264, 265, . . . , which from Schottky barriers with the semiconductor body 233, are disposed on the surface of the semiconductor body 233 between the insulating layers 260, 261, 262, . . . and the insulating layers, so that the electrode on the surface of the semiconductor body 233 is connected to the electrode disposed on the insulating layers.

It will be apparent from the above described explanation of the embodiments that the present invention provides a charge transfer semiconductor device having many advantages, such as high transferring velocity, high transferring efficiency, high integration, high intensity output signal and easiness of fabrication, since majority carriers are transferred as the signal and the polycrystalline semiconductor material can be utilized as the semiconductor body in which the majority carriers are transferred.

While the invention has been explained in detail, it is to be understood that the technical scope of the present invention is not limited to that of the foregoing embodiments. For example, as the semiconductor body in which the majority carriers are transferred, Si is utilized in the embodiments; yet, other semiconductor materials such as Ge, compound semiconductor materials, GaAs, and amorphous semiconductor materials, Se-Ge-As are useful. Therefore, the present invention is applicable to all charge transfer semiconductor devices as defined in the claims.

We claim:

1. A bulk charge transfer semiconductor device comprising:
    a substrate;
    a semiconductor body wherein majority carriers are to be transferred, disposed on the substrate, which is electrically isolated from the substrate;
    a series of electrodes disposed over the semiconductor body while being electrically isolated from the semiconductor body;
    means for introducing majority carriers into the semiconductor body, disposed on the semiconductor body, disposed on the semiconductor body adjacent one end of said series of electrodes;
    means for detecting said introduced majority carriers, disposed on said semiconductor body adjacent the other end of said series of electrodes; and
    means for applying voltages to the electrodes for forming depletion regions within the semiconductor body so that majority carriers are pushed out by said depletion regions toward said detecting means, thereby transferring introduced majority carriers along the semiconductor body; and wherein
    the thickness of the semiconductor body is less than the depth of said depletion regions and the width of the semiconductor body, which is the dimension of the semiconductor body perpendicular to the direction in which the majority carriers are transferred, is less than the total length of the width of an electrode in a direction perpendicular to the transit direction of the majority carriers and parallel to the surface of said semiconductor body and twice the depletion width spread from the edges of an electrode toward a direction perpendicular to said transit direction and parallel to the surface of said semiconductor body.

2. A bulk charge transfer semiconductor device according to claim 1, further including an insulating layer disposed between said series of electrodes and said semiconductor body.

3. A bulk charge transfer semiconductor device according to claim 1, wherein said series of electrodes is disposed on a series of semiconductor regions whose conductivity type is opposite to that of the semiconductor body and which is disposed in the semiconductor body, respectively.

4. A bulk charge transfer semiconductor device according to claim 1, wherein said electrodes are electrodes which form Schottky barriers with the semiconductor body and are directly disposed on the semiconductor body.

5. A bulk charge transfer semiconductor device according to claim 1, wherein the semiconductor body is in the monocrystalline state.

6. A bulk charge transfer semiconductor device according to claim 1, wherein the semiconductor body is in the polycrystalline state.

7. A bulk charge transfer semiconductor device according to claim 1, wherein said substrate consists of monocrystalline semiconductor material having a conductivity type opposite to that of the semiconductor body.

8. A bulk charge transfer semiconductor device according to claim 1, wherein said substrate consists of insulating material.

9. A bulk charge transfer semiconductor device according to claim 8, wherein an insulating layer is directly disposed on the substrate, the semiconductor body disposed on the insulating layer and the series of electrodes are disposed within the insulating layer.

10. A bulk charge transfer semiconductor device according to claim 9, which further comprises another insulating layer disposed on the semiconductor body, and another series of electrodes disposed on said another insulating layer so that the respective series of electrodes overlap each other.

11. A bulk charge transfer semiconductor device according to claim 10, wherein the dimension of each electrode of said another series of electrodes in the transit direction of the majority carriers is greater than that of the first mentioned series of electrodes and is disposed so that a part of each electrode of said another series is displaced from each electrode of the series of electrodes disposed within the insulating layer.

12. A bulk charge transfer semiconductor device according to claim 2, wherein the semiconductor body has a structure having alternately different thicknesses, and each electrode of the series of electrodes is disposed on the insulating layer so as to cover adjacent thick and thin portions of the semiconductor body.

13. A bulk charge transfer semiconductor device according to claim 2, wherein the insulating layer has a structure having alternately different thicknesses, and each electrode of the series of electrodes is disposed on the insulating layer so as to cover adjacent thick and thin portions of the insulating layer.

14. A bulk charge transfer semiconductor device according to claim 1, wherein the semiconductor body has a alternately different impurity concentration regions therein, and each electrode of the series of electrodes is disposed so as to cover a pair of adjacent different impurity concentration regions.

15. A bulk charge transfer semiconductor device according to claim 1, wherein the semiconductor body has a turned portion on the substrate.

16. A bulk charge transfer semiconductor device according to claim 15, which further comprises a semiconductor region having a high impurity concentration than that of the semiconductor body, which is disposed in the turned portion of the semiconductor body.

17. A bulk charge transfer semiconductor device according to claim 15, which further comprises a metal layer disposed on the surface of the turned portion of the semiconductor body.

18. A bulk charge transfer semiconductor device according to claim 1, wherein said detecting means has the structure of a transistor.

19. A bulk charge transfer semiconductor device according to claim 1, which further comprises means for detecting majority carriers by their transit disposed adjacent at least one electrode of the series of electrodes.

20. A bulk charge transfer semiconductor device according to claim 14, wherein each electrode of the series of electrodes is disposed on the high impurity concentration region.

21. A bulk charge transfer semiconductor device according to claim 1, which further comprises semiconductor regions having an opposite conductivity type to that of the semiconductor body disposed at the surface portion of the semiconductor body corresponding to gaps between the electrodes.

22. A bulk charge transfer semiconductor device according to claim 2, which further comprises another insulating layer disposed on said first mentioned insulating layer and the series of electrodes, and another series of electrodes disposed on said another insulating layer corresponding to gaps between the first series of electrodes.

23. A bulk charge transfer semiconductor device according to claim 7, which further comprises semiconductor regions having a higher impurity concentration than that of the semiconductor substrate disposed in the semiconductor substrate corresponding to gaps between the electrodes.

24. A bulk charge transfer semiconductor device according to claim 1, which further comprises semiconductor regions having an opposite conductivity type to that of the semiconductor body, disposed at the surface portion of the semiconductor body so that each electrode of the series of electrodes covers the each semiconductor region, which is disposed at one side of each electrode to which no majority carriers are transferred.

25. A bulk charge transfer semiconductor device according to claim 3, which further comprises insulating layers, each of which is disposed between the semiconductor regions and each of the series of electrodes is disposed on each of the semiconductor regions and each of the insulating layers.

26. A bulk charge transfer semiconductor device according to claim 3, which further comprises another series of semiconductor regions whose conductivity type is opposite to that of the semiconductor body disposed between the semiconductor regions so that each of said another semiconductor regions is connected to each of said semiconductor regions.

27. A bulk charge transfer semiconductor device according to claim 22, wherein each electrode of said first series of electrodes is connected to each electrode of said another series of electrodes.

28. A bulk charge semiconductor device comprising:
a semiconductor body of a first conductivity type through which majority carriers within said body are to be transferred;
a plurality of spaced-apart electrodes disposed over a principal surface of said semiconductor body;
first means, coupled to said semiconductor body, for introducing majority carriers thereinto;
second means, connected to said electrodes, for forming controlled depletion regions extending completely through the thickness of said semiconductor body so as to push out said introduced majority carriers and transferring majority carriers along said body beneath said electrodes by applying voltages to said electrodes; and
third means, coupled to said semiconductor body, for detecting majority carriers which have been transferred through said semiconductor body; and
wherein the thickness of said semiconductor body in a direction perpendicular to the direction of transfer of said majority carriers is less than the total of the width of an electrode in a direction perpendicular to the direction of the transit of majority carriers and parallel to the surface of said semiconductor body and twice the depletion width spread from the edges of an electrode in a direction perpendicular to said transit direction and parallel to the surface of said semiconductor body.

29. A bulk charge transfer device according to claim 28, further including a substrate over which said semiconductor body is disposed.

30. A bulk charge transfer device according to claim 28, further including a layer of insulator material disposed directly on said semiconductor body with said electrodes being disposed directly on said layer of insulator material.

31. A bulk charge transfer device according to claim 28, wherein said electrodes comprise conductors attached to a respective plurality of spaced-apart semiconductor regions of a second conductivity type opposite said first conductivity type forming a plurality of p-n junctions with said semiconductor body.

32. A bulk charge transfer device according to claim 14, further including an insulating layer disposed between said electrodes and said semiconductor body.

33. A bulk charge transfer device according to claim 29, wherein said semiconductor body comprises a plurality of substantially parallel linear first portions, adjacent ones of which are alternately connected by second portions, which extend in a direction perpendicular to said first portions, at alternately opposite ends of said first portions.

34. A bulk charge transfer device according to claim 33, wherein said second portions include semiconductor regions having a higher impurity concentration than that of said semiconductor body, disposed therein.

35. A bulk charge transfer device according to claim 33, further including respective metal layers disposed in said second portions in alignment with the electrodes disposed over the first portions of said semiconductor body.

36. A bulk charge transfer device according to claim 28, wherein said third means comprises a transistor formed within said semiconductor body adjacent one of said electrodes.

37. A bulk charge transfer device according to claim 36, wherein said transistor comprises a pair of semiconductor regions of a second conductivity type, opposite said first conductivity type, disposed in opposite surface portions of said semiconductor body with a portion of said body therebetween separating the semiconductor regions from each other.

38. A bulk charge transfer device according to claim 36, wherein said transistor comprises a pair of semiconductor regions of a second conductivity type, opposite said first conductivity type, disposed in the same surface of said semiconductor body with a portion of said semiconductor body separating said semiconductor regions from each other.

39. A bulk charge transfer device according to claim 38, wherein about three-quarters of one of the regions of said pair is surrounded by the other region of said pair.

40. A bulk charge transfer device according to claim 38, wherein one of the regions of said pair is completely surrounded by the other region of said pair.

41. A bulk charge transfer device according to claim 38, further including a Schottky barrier layer formed on said semiconductor body between said pair of regions.

42. A bulk charge transfer device according to claim 28, wherein said third means comprises a higher impurity concentration semiconductor region disposed in said semiconductor body adjacent one of said electrodes, an MOS-FET transistor disposed in said body apart from said higher impurity concentration semiconductor region, the gate electrode of which extends to and contacts said high impurity concentration semiconductor region.

43. A bulk charge transfer device according to claim 29, wherein said third means comprises at least one MOS-type transistor disposed in a portion of said substrate adjacent to but separated from said semiconductor body, the gate electrode of said transistor being connected to an extending portion of said semiconductor body adjacent one of said electrodes.

44. A bulk charge transfer device according to claim 43, wherein said MOS-type transistor includes a pair of source and drain semiconductor regions of said first conductivity type, but having an impurity concentration greater than that of said semiconductor body disposed in said substrate, and a gate semiconductor region of said first conductivity type disposed in said substrate between said source and drain regions.

45. A bulk charge transfer device according to claim 43, wherein said MOS-type transistor includes a pair of source and drain semiconductor regions of said first conductivity type, but having an impurity concentration greater than that of said semiconductor body, disposed in said substrate which is made of a semiconductor material of a second conductivity type opposite said first conductivity type.

46. A bulk charge transfer device according to claim 43, wherein said MOS-type transistor includes a pair of source and drain semiconductor regions of a second conductivity type, opposite to said first conductivity type, disposed in a semiconductor region of said first conductivity type which is formed in said substrate adjacent to but separated from said semiconductor body.

47. A bulk charge transfer device according to claim 43, wherein said at least one MOS-type transistor comprises a plurality of MOS-type transistors, the source and drain regions of which are respectively connected in parallel and the gate electrodes of which are connected to individual ones of said plurality of electrodes.

48. A bulk charge transfer device according to claim 28, wherein said semiconductor body has adjacent contiguous portions of alternately different thicknesses and further including semiconductor regions of a second conductivity type opposite said first conductivity type each of which is formed in said body so as to overlap adjacent thick and thin portions thereof.

49. A bulk charge transfer device according to claim 28, wherein said semiconductor body has adjacent contiguous portions of alternately different thicknesses and wherein each of said electrodes is disposed to overlap a respective thin and thick portion of said semiconductor body and to form a Schottky barrier therewith.

50. A bulk charge transfer device according to claim 24, wherein said semiconductor regions are formed in said semiconductor body and each of said electrodes is disposed directly on a semiconductor region and a portion of said body adjacent thereto.

51. A bulk charge transfer device according to claim 30, wherein said layer of insulating material comprises a plurality of spaced apart portions disposed on said body and each of said electrodes further extends onto a respective portion of said semiconductor body between adjacent insulating layer portions.

52. A bulk charge transfer semiconductor device according to claim 1, wherein the semiconductor body has alternately different impurity concentration regions therein, and each electrode of the series of electrodes is disposed so as to cover only one of a pair of adjacent different impurity concentration regions.

53. A bulk charge transfer semiconductor device according to claim 52, wherein each electrode of the series of electrodes is disposed over the high impurity concentration region.

54. A bulk charge transfer semiconductor device according to claim 52, further including an insulating layer disposed between said electrodes and said semiconductor body.

55. A bulk charge transfer semiconductor device comprising:
   a semiconductor body of a first conductivity type through which majority carriers within said body are transferred;
   a plurality of spaced-apart electrodes disposed over a principal surface of said semiconductor body;
   first means, coupled to said semiconductor body, for introducing majority carriers therein;
   second means, connected to said electrodes, for forming first depletion regions extending completely through the thickness of said semiconductor body so as to push out said introduced majority carriers and transferring majority carriers along said body beneath said electrodes by applying voltages to said electrodes;
   third means, coupled to said semiconductor body, for detecting majority carriers which have been transferred through said semiconductor body; and
   fourth means, coupled to said semiconductor body, for forming second depletion regions at portions in said semiconductor body corresponding to all the gaps between said electrodes; and
   wherein the thickness of said semiconductor body in a direction perpendicular to the direction of transfer of said majority carriers is less than the total of the width of an electrode in a direction perpendicular to the direction of the transit of majority carriers and parallel to the surface of said semiconductor body and twice the depletion width of the first depletion region spread from the edges of an electrode in a direction perpendicular to said transit direction and parallel to the surface of said semiconductor body.

56. A bulk charge transfer semiconductor device according to claim 55, wherein said semiconductor body comprises first impurity concentration regions and second impurity concentration regions, each of which is disposed between a pair of said first impurity concentration regions and acts as said fourth means, and each electrode of said spaced-apart electrodes is disposed so as to cover only one of a pair of adjacent first and second impurity concentration regions.

57. A bulk charge transfer semiconductor device according to claim 56, wherein the impurity concentration of said first impurity concentration regions is higher than that of said second impurity concentration regions.

58. A bulk charge transfer semiconductor device according to claim 57, wherein each electrode of said spaced apart electrodes is disposed on said first impurity concentration regions.

59. A bulk charge transfer semiconductor device according to claim 56, further including an insulating layer disposed between said spaced-apart electrodes and said semiconductor body.

60. A bulk charge transfer semiconductor device according to claim 55, wherein said spaced-apart electrodes contact with said semiconductor body and form Schottky barrier with said semiconductor body.

61. A bulk charge transfer semiconductor device according to claim 55, which further comprises semiconductor regions of a second conductivity type are disposed in said semiconductor body under at least a part of each of said spaced-apart electrodes, and wherein said fourth means comprises insulating layers disposed on said semiconductor body at all portions of gaps between said spaced-apart electrodes, and another electrodes disposed on said insulating layers.

62. A bulk charge transfer semiconductor device according to claim 55, wherein said semiconductor body comprises first impurity concentration region and second impurity concentration region, each of which is disposed between a pair of said first impurity concentration regions and acts as said fourth means, and each electrode of said spaced-apart electrodes is disposed so as to cover a pair of adjacent first and second impurity concentration regions.

63. A bulk charge transfer semiconductor device according to claim 62, wherein an impurity concentration of said first impurity concentration region is higher than that of said second impurity concentration regions.

64. A bulk charge transfer semiconductor device according to claim 63, wherein each electrode of said spaced-apart electrodes is disposed on said first impurity concentration regions.

65. A bulk charge transfer semiconductor device according to claim 55, wherein said fourth means comprise semiconductor regions having a second conductivity type relative to that of said semiconductor body disposed at the surface portion of semiconductor body corresponding gaps between said spaced-apart electrodes.

66. A bulk charge transfer semiconductor device according to claim 55, which further comprises a first insulating layer disposed between said spaced-apart electrodes and said semiconductor body, and wherein said fourth means comprises a second insulating layer disposed on said first insulating layer and said spaced-apart electrodes, and another spaced-apart electrodes disposed on said second insulating layer corresponding gaps between said spaced-apart electrodes.

67. A bulk charge transfer semiconductor device according to claim 66, wherein each electrode of said spaced-apart electrode is connected to each electrode of said another spaced-apart electrodes.

68. A bulk charge transfer semiconductor device according to claim 55, which further including a semiconductor substrate having a second conductivity type over which said semiconductor body is disposed, and wherein said fourth means comprises semiconductor regions having a higher impurity concentration than that of the semiconductor substrate disposed in the semiconductor substrate corresponding to gaps between said spaced-apart electrodes.

69. A bulk charge transfer semiconductor device according to claim 62, further including an insulating layer disposed between said spaced-apart electrodes and said semiconductor body.

70. A bulk charge transfer semiconductor device according to claim 55, wherein said semiconductor body commprises a plurality of substantially parallel linear first portions which act as said fourth means, adjacent ones of which are alternately connected by second portions, which extend in a direction perpendicular to said first portion, at alternately opposite ends of said first portions.

71. A bulk charge transfer semiconductor device according to claim 70, wherein said second portions include semiconductor regions having a higher impurity concentration than that of said semiconductor body, disposed therein.

72. A bulk charge transfer semiconductor device according to claim 71, further including respective metal layers disposed in said second portions in alignment with the electrodes disposed over the first portions of said semiconductor body.

73. A bulk charge transfer semiconductor device comprising:
- a semiconductor body of a first conductivity type through which majority carriers within said body are to be transferred;
- a plurality of spaced-apart electrodes disposed in a principal surface of said semiconductor body, which comprises semiconductor regions of a second conductivity type;
- first means, coupled to said semiconductor body, for forming first depletion regions extending completely through the thickness of said semiconductor body so as to push out said introduced majority carriers and transferring majority carriers along said body beneath said electrodes by applying voltages to said electrodes;
- third means coupled to said semiconductor body, for detecting majority carriers which have been transferred through said semiconductor body; and
- fourth means, coupled to said semiconductor body, for forming second depletion regions at portions in said semiconductor body corresponding to all the gaps between said electrodes; and
- wherein the thickness of said semiconductor body in a direction perpendicular to the direction of transfer of said majority carriers is less than the total of the width of an electrode in a direction perpendicular to the direction of the transit of majority carriers and parallel to the surface of said semiconductor body and twice the depletion width of the first depletion region spread from the edges of an electrode in a direction perpendicular to said transit direction and parallel to the surface of said semiconductor body.

* * * * *